United States Patent
Chang et al.

(10) Patent No.: US 9,083,375 B1
(45) Date of Patent: Jul. 14, 2015

(54) ASYNCHRONOUS SUCCESSIVE APPROXIMATION REGISTER ADC

(71) Applicants: NCKU Research and Development Foundation, Tainan (TW); Himax Technologies Limited, Tainan (TW)

(72) Inventors: Soon-Jyh Chang, Tainan (TW); Che-Hsun Kuo, Tainan (TW); Chung-Ming Huang, Tainan (TW)

(73) Assignees: NCKU Research and Development Foundation, Tainan (TW); Himax Technologies Limited, Tainan (TW)

( * ) Notice: Subject to any disclaimer, the term of this patent is extended or adjusted under 35 U.S.C. 154(b) by 0 days.

(21) Appl. No.: 14/182,222

(22) Filed: Feb. 17, 2014

(51) Int. Cl.
*H03M 1/12* (2006.01)
*H03M 1/44* (2006.01)
*H03M 1/80* (2006.01)
*H03M 1/00* (2006.01)

(52) U.S. Cl.
CPC ............. *H03M 1/442* (2013.01); *H03M 1/125* (2013.01); *H03M 1/00* (2013.01); *H03M 1/12* (2013.01); *H03M 1/804* (2013.01)

(58) Field of Classification Search
CPC .......... H03M 1/804; H03M 1/00; H03M 1/12
USPC ................... 341/156, 155, 172, 110, 158, 163
See application file for complete search history.

(56) References Cited

U.S. PATENT DOCUMENTS

2005/0258998 A1* 11/2005 Confalonieri et al. ........ 341/172

* cited by examiner

*Primary Examiner* — Joseph Lauture
(74) *Attorney, Agent, or Firm* — Donald E. Stout; Stout Uxa & Buyan, LLP

(57) ABSTRACT

A successive approximation register analog-to-digital converter (SAR ADC) includes a comparator coupled to receive a sampled input voltage; a pair of arrays each including individually switchable binary-weighted capacitors that are switchably coupled to an output of the comparator via phase switches, respectively. A phase signal for controlling a corresponding phase switch associated with a current bit becomes asserted when a preceding bit finishes comparison, and the phase signal becomes de-asserted when the current bit finishes comparison.

13 Claims, 9 Drawing Sheets

ASYNCHRONOUS SUCCESSIVE APPROXIMATION REGISTER ADC

BACKGROUND OF THE INVENTION

1. Field of the Invention

The present invention generally relates to a successive approximation register (SAR) analog-to-digital converter (ADC), and more particularly to an asynchronous SAR ADC.

2. Description of Related Art

A successive approximation register (SAR) analog-to-digital converter (ADC) is one of a variety of ADCs that covert an analog signal to a digital equivalent of the signal. The SAR ADC performs conversion by comparison and searching through all possible quantization levels to obtain a digital output. The SAR ADC requires less silicon area and associated cost than other ADC architectures. However, the SAR ADC needs more cycles to obtain the digital output, and therefore does not fit for high speed applications.

An asynchronous SAR ADC has been disclosed to speed up the operation of the SAR ADC. However, the conventional asynchronous SAR ADC may begin the comparison even some capacitors have not even been stable, thus resulting in incomplete settling that generates erroneous digital output.

For the reason that conventional SAR ADCs could not effectively and correctly speed up the operation, a need has arisen to propose a novel SAR ADC to overcome the disadvantages of the conventional SAR ADCs.

SUMMARY OF THE INVENTION

In view of the foregoing, it is an object of the embodiment of the present invention to provide a successive approximation register analog-to-digital converter (SAR ADC) that is operated in an asynchronous manner during comparison and/or settling.

According to one embodiment, a SAR ADC includes a sample circuit, a comparator and a pair of arrays. The sample circuit is configured to sample an input voltage, thereby resulting in a sampled input voltage. The comparator is coupled to receive the sampled input voltage. Each array includes individually switchable binary-weighted capacitors that are switchably coupled to an output of the comparator via phase switches, respectively. A phase signal for controlling a corresponding phase switch associated with a current bit becomes asserted when a preceding bit finishes comparison, and the phase signal becomes de-asserted when the current bit finishes comparison.

DETAILED DESCRIPTION OF THE INVENTION

Figure 1:
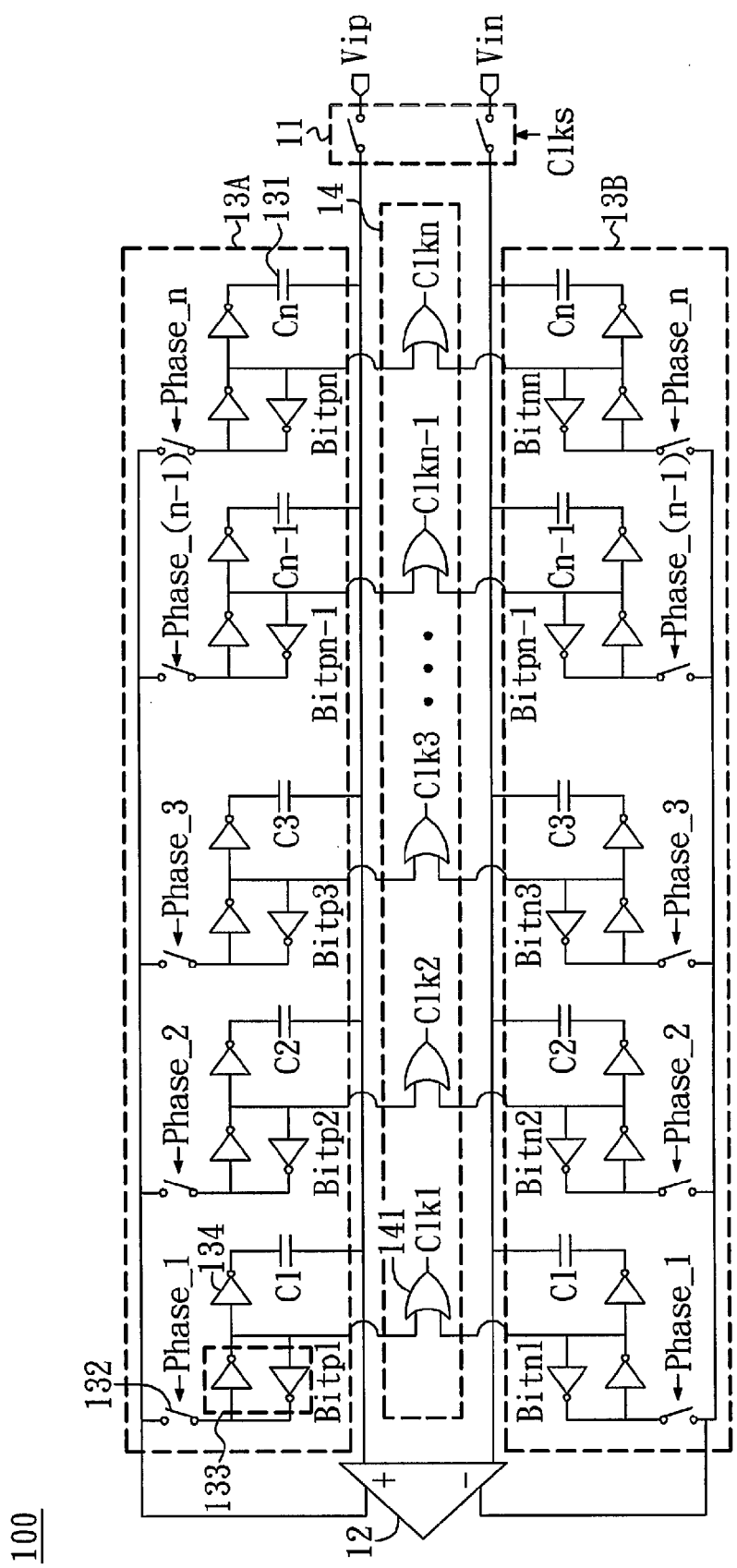
FIG. 1 shows a circuit illustrating a successive approximation register analog-to-digital converter (SAR ADC) according to one embodiment of the present invention.

FIG. 1 shows a circuit illustrating a successive approximation register analog-to-digital converter (SAR ADC) 100 according to one embodiment of the present invention. As a differential signaling scheme is adopted in the embodiment, an input voltage may be composed of two complementary signals (or a differential pair of) Vin and Vip.

The SAR ADC 100 of the embodiment may include a sample circuit 11, which is used to sample the input voltage Vin/Vip under control of a sample clock Clks, therefore resulting in a sampled input voltage. The SAR ADC 100 may also include an (analog) comparator 12 with a non-inverting input and an inverting input, which are respectively coupled to receive complementary signals of the sampled input voltage.

The SAR ADC 100 may include a digital-to-analog converter (DAC) that may be composed of a pair of arrays (13A and 13B), each including individually switchable binary-weighted capacitors 131 (C1-Cn). Specifically, regarding the first array 13A, first ends of the capacitors 131 (C1-Cn) are coupled to the non-inverting input of the comparator 12, and second ends of the capacitors 131 (C1-Cn) are switchably coupled to a first output of the comparator 12 via phase switches 132 (SW1-SWn), respectively. Similarly, regarding the second array 13B, first ends of the capacitors 131 (C1-Cn) are coupled to the inverting input of the comparator 12, and second ends of the capacitors 131 (C1-Cn) are switchably coupled to a second output of the comparator 12 via phase switches 132 (SW1-SWn), respectively.

According to the SAR ADC 100 as exemplified in FIG. 1, the comparator 12 performs comparison for the binary search from a most-significant-bit (MSB) to a least-significant-bit (LSB) in sequence. The capacitors 131 (C1-Cn), for example, are respectively associated with bit 1 to bit n, where the capacitor 131 (C1) with largest capacitance is associated with the MSB and the capacitor 131 (Cn) with smallest capacitance is associated with the LSB. The phase switch 132 associated with a bit under comparison is closed under control of a corresponding phase signal, while other phase switches 132 are open. For example, the phase switch 132 (SW2) associated with bit 2 under comparison is close under control of a corresponding phase signal (Phase_2), while other phase switches 132 (SW1 and SW3-SWn) are open.

According to one aspect of the embodiment, the phase switches 132 during binary-search comparison are operated in an asynchronous manner. In general, less-significant-bit requires more time for performing binary-search comparison than more-significant-bit. Specifically speaking, a phase signal (e.g., Phase_m+1) associated with a bit (e.g., bit m+1) becomes asserted (being capable of closing a corresponding phase switch SWm+1) when a preceding bit (i.e., bit m) finishes comparison, that is, voltages across the corresponding capacitors 131 (i.e., Cm) of the arrays 13A and 13B become distinct (that is, one being logic "1" and the other being logic "0"). The phase signal (e.g., Phase_m+1) of an associated bit (e.g., bit m+1) becomes de-asserted (being capable of opening a corresponding phase switch SWm+1) when a current bit (i.e., bit m+1) finishes comparison, that is, voltages across the corresponding capacitors 131 (i.e., Cm+1) of the arrays 13A and 13B become distinct (that is, one being logic "1" and the other being logic "0").

The comparison finish mentioned above may be detected by a timing logic 14, for example, composed of OR gates 141 respectively corresponding to the bits under binary search. Each OR gate 141 has two inputs respectively coupled to receive inverted logic states of the capacitors 131, and accordingly generates a finish signal (Clk1/Clk2 . . . /Clkn). Accordingly, when a bit finishes comparison, that is, voltages across the corresponding capacitors 131 of the arrays 13A and 13B become distinct (that is, one being logic "1" and the other being logic "0"), an output of the OR gate 141 becomes logic "1" (from original logic "0"). In the embodiment, in order not to interfere with charge on the capacitors 131, the voltage across the capacitor 131 is indirectly retrieved, for example, from an intermediate node located between a latch 133 and an inverter 134, where the latch 133 and the inverter 134 are disposed between the phase switch 132 and the capacitor 131. As schematically shown in FIG. 1, the latch 133 may be composed of two inverters that are cross-coupled in a closed loop. Details of the latch 133 will be illustrated later in the specification.

Figure 2:
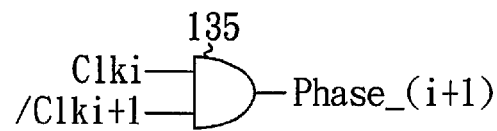
FIG. 2 shows a circuit illustrating the generation of a phase signal in the SAR ADC of FIG. 1.
Figure 3:
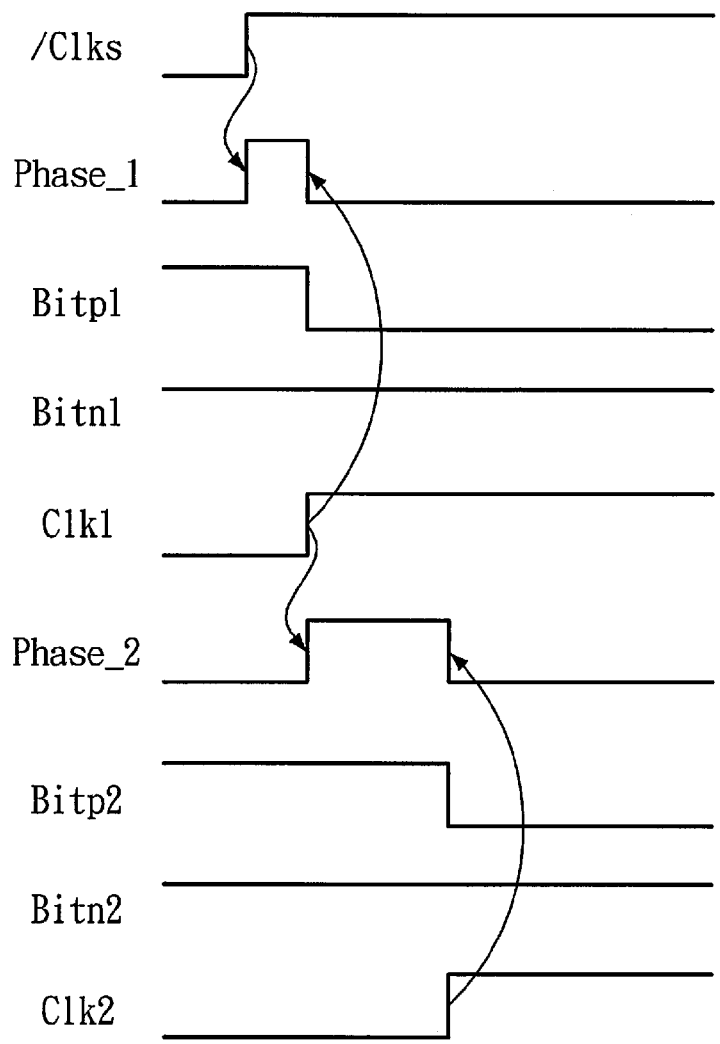
FIG. 3 shows an exemplary timing diagram demonstrating the generation of the phase signal in companion with FIG. 2.

As described above, the phase signal becomes asserted when a preceding bit finishes comparison, and the phase signal becomes de-asserted when a current bit finishes comparison. In one embodiment, as shown in FIG. 2, the phase signal (Phase_i+1) of a bit i+1 may be generated using a (phase generating) AND gate 135 with two inputs coupled to receive a finish signal Clki of a preceding bit i and an inverted finish signal /Clki+1 of a current bit i+1. FIG. 3 shows an exemplary timing diagram demonstrating the generation of the phase signal. It is noted that, with respect to the phase signal (Phase_1) of bit 1, an inverted sample clock /Clks is used instead of the finish signal Clki.

According to the embodiment described above, not only the phase switches 132 may be operated in an asynchronous manner during binary-search comparison, but also complexity of a SAR control circuit in a conventional SAR ADC may be decreased by using a simple logic circuit such as the timing logic 14 of OR gates 141 (FIG. 1) and the AND gate 135 (FIG. 2).

Figure 4:
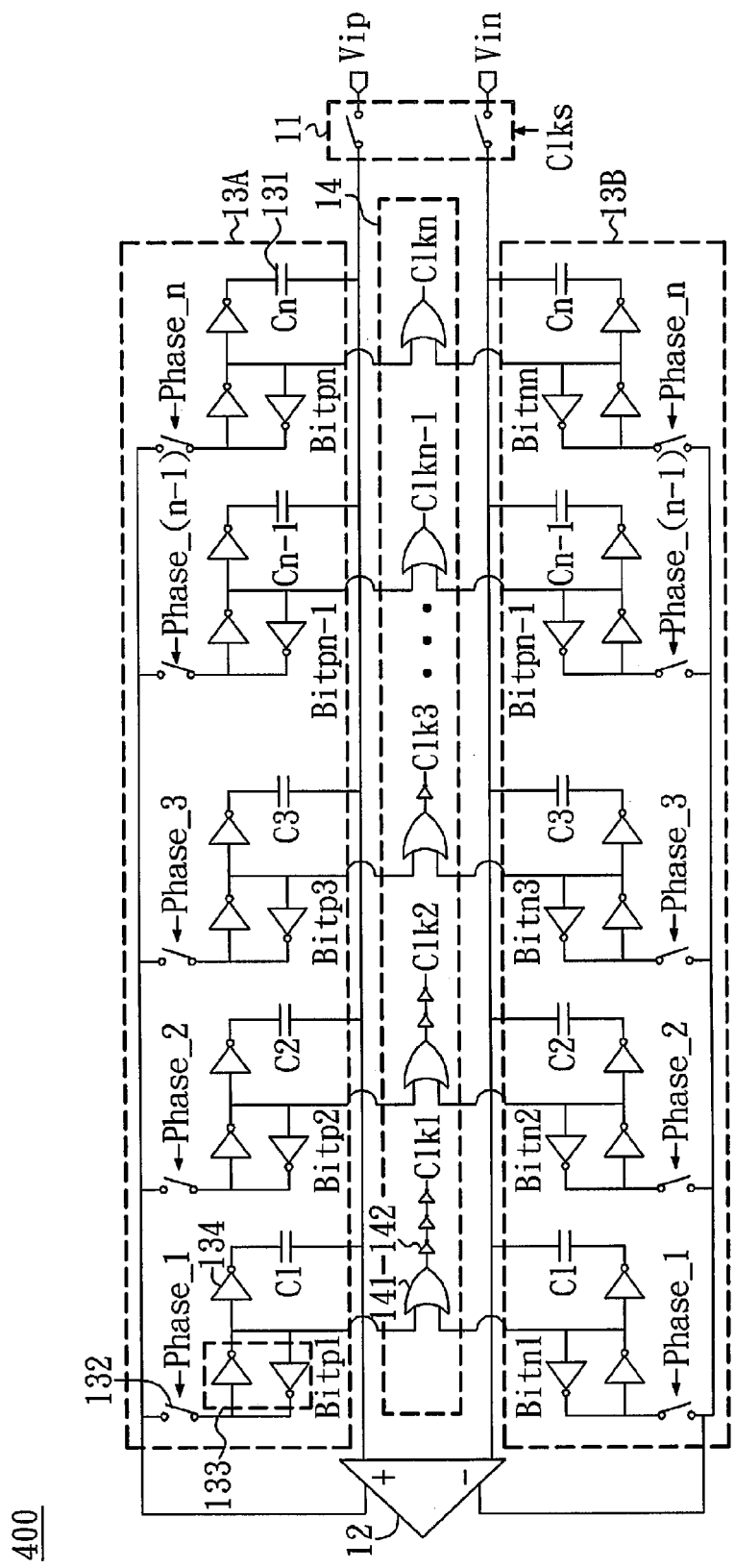
FIG. 4 shows a circuit illustrating a SAR ADC according to another embodiment of the present invention.

FIG. 4 shows a circuit illustrating a SAR ADC 400 according to another embodiment of the present invention. The present embodiment has an architecture similar to that of FIG. 1, with the exception that one or more delay cells (e.g., inverter) 142 are cascaded after some OR gates 141. According to one aspect of the embodiment, more delay cells 142 are used with respect to a more-significant-bit than a less-significant-bit, for a rationale that the capacitor 131 with larger capacitance associated with a more-significant-bit requires more time to be stable.

Figure 5:
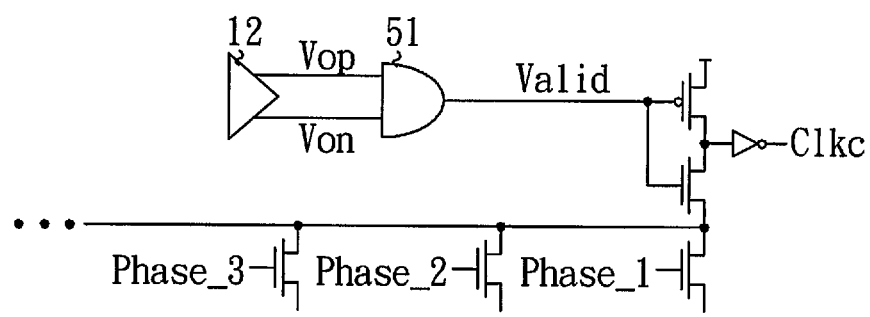
FIG. 5 shows a circuit for generating a compare clock adaptable to the SAR ADC of FIG. 4.

According to another aspect of the embodiment, the settling time of the DAC (13A and 13B) is asynchronous or adaptive. Specifically, in the embodiment, the comparator 12 performs comparison only when output voltages Vop and Von of the comparator 12 become valid and the capacitors 131 become stable. FIG. 5 shows a circuit for generating a compare clock Clkc adaptable to the SAR ADC 400 of FIG. 4. As shown in the figure, an AND gate 51 is coupled to receive output voltages Vop and Von of the comparator 12, therefore generating a valid signal (Valid). The compare clock Clkc becomes asserted only when the valid signal (Valid) is asserted (i.e., logic "1") and at least one phase signal (Phase_1/Phase_2 . . . ), particularly phase signals associated with more-significant-bit, is asserted (i.e., logic "1"). Accordingly, the settling time of the DAC (13A and 13B) is thus asynchronous by adaptively taking setting time of the DAC (13A and 13B) into consideration.

Figure 6A:
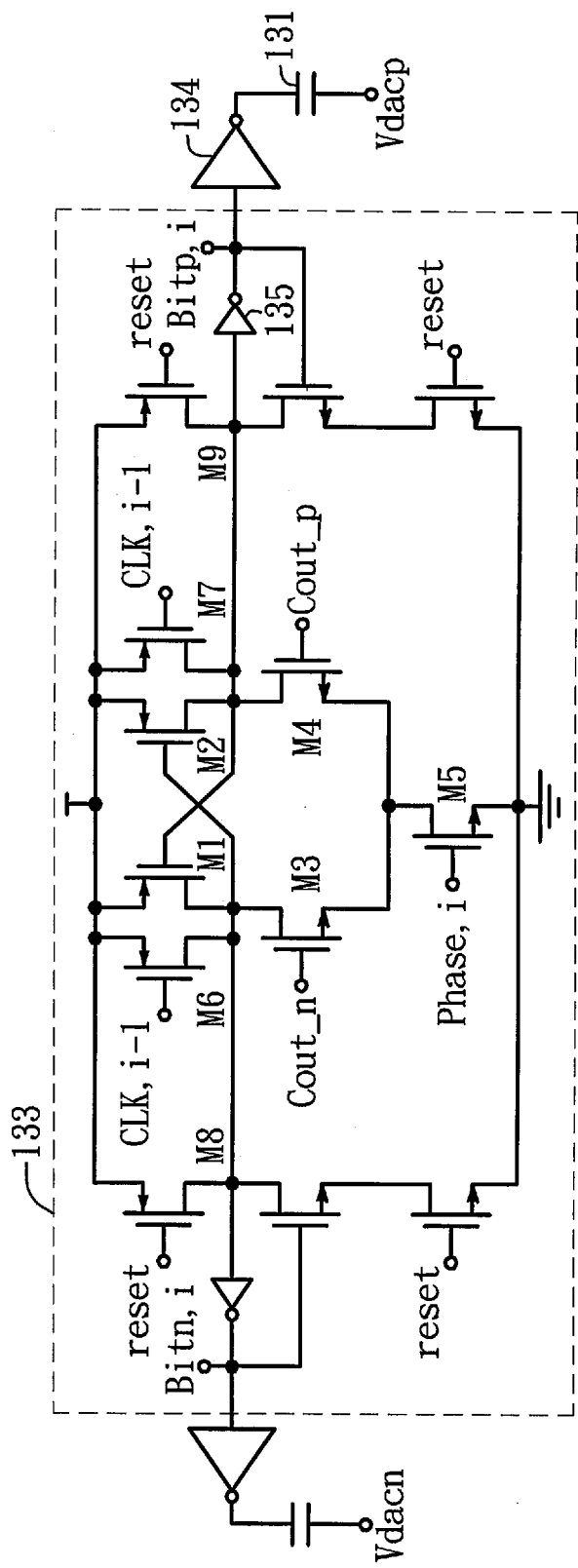
FIG. 6A shows a detailed circuit illustrating the latch of FIG. 1 according to one embodiment of the present invention.
Figure 6B:
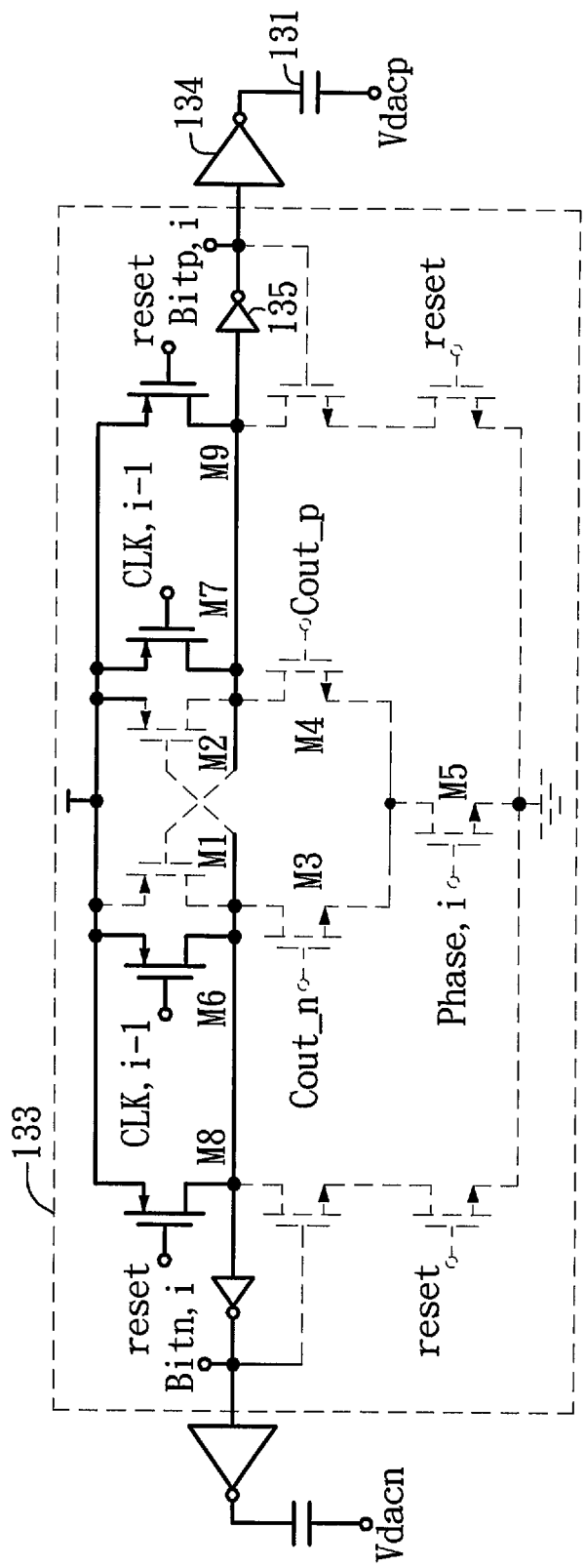
FIG. 6B to FIG. 6E show operating phases of the latch of FIG. 6A.

FIG. 6A shows a detailed circuit illustrating the latch 133 of FIG. 1 according to one embodiment of the present invention. The circuit shown in FIG. 6A includes a pair of latches 133 corresponding to a bit i (i.e., bitp,i and bitn,i).

In the embodiment, the latch 133 primarily includes a memory circuit (M1-M5) composed of cross-coupled transistors (e.g., P-type metal-oxide-semiconductor (PMOS) transistors) M1 and M2, two compare transistors (e.g., N-type metal-oxide-semiconductor (NMOS) transistors) M3 and M4 coupled to receive comparison outputs Cout_n and Cout_p from the comparator 12, and a phase transistor (e.g., NMOS transistor) M5 coupled to receive a phase signal (Phase,i). The latch 133 also includes two finish transistors (e.g., PMOS transistors) M6 and M7, which are respectively connected in parallel with the cross-coupled transistors M1 and M2, and are respectively coupled to receive a finish signal (CLK,i−1). The latch 133 further includes two reset transistors (e.g., PMOS transistors) M8 and M9, which are respectively connected in parallel with the finish transistors M6 and M7, and are respectively coupled to receive a reset signal (reset) that is the same as the inverted sample clock /Clks. Two inverters 135 are respectively coupled to receive outputs of the memory circuit (M1-M5). Outputs of the inverters 135 are fed to inputs of the OR gate 141 (FIG. 1).

FIG. 6B to FIG. 6E show operating phases of the latch 133 of FIG. 6A. Specifically, in a reset phase shown in FIG. 6B with solid lines indicating signal paths in the current phase, sampled input voltages Vdacp and Vdacn are accumulated on upper plates of the capacitors 131. As the reset signal (reset) and the finish signal (CLK,i−1) are both logic "0", the latch 133 is reset such that lower plates of the capacitors 131 are reset to a predetermined voltage level (e.g., Vdd).

Figure 6C:
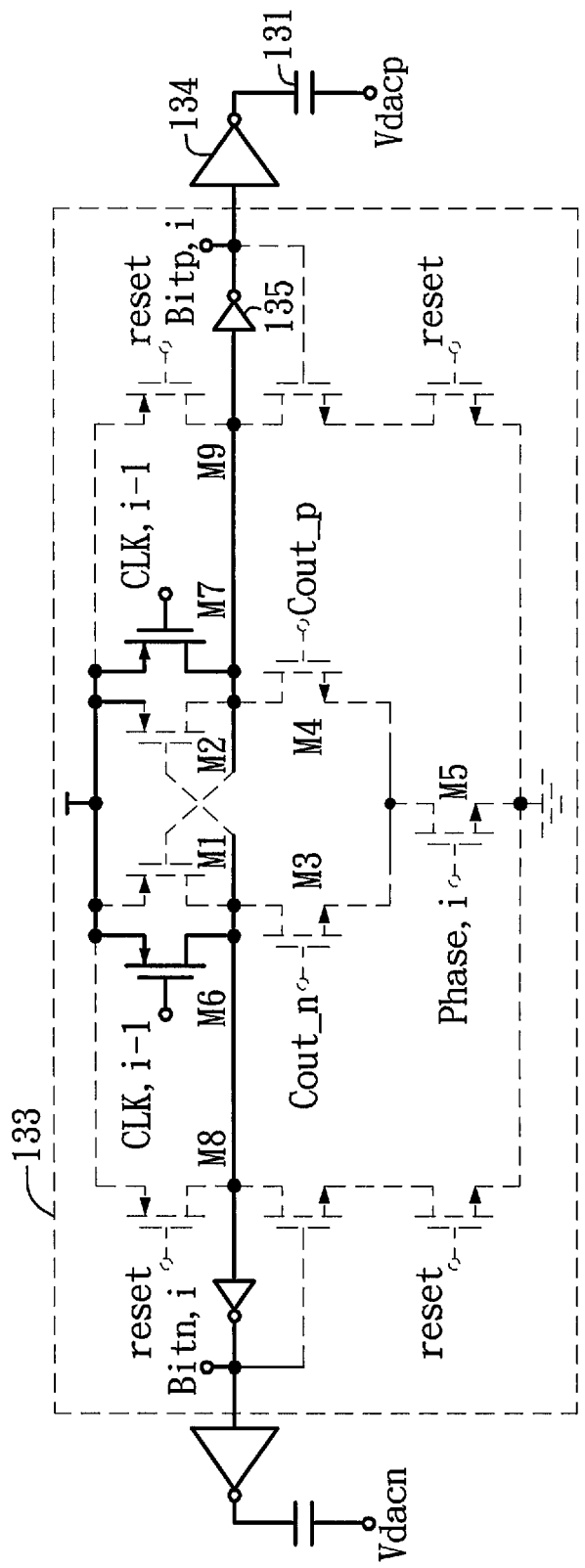

Next, in an idle phase shown in FIG. 6C with solid lines indicating signal paths in the current phase, as the reset signal (reset) becomes logic "1" while the finish signal (CLK,i−1) remains logic "0", the voltage (e.g., Vdd) at the lower plates of the capacitors 131 may thus be kept without being discharged.

Figure 6D:
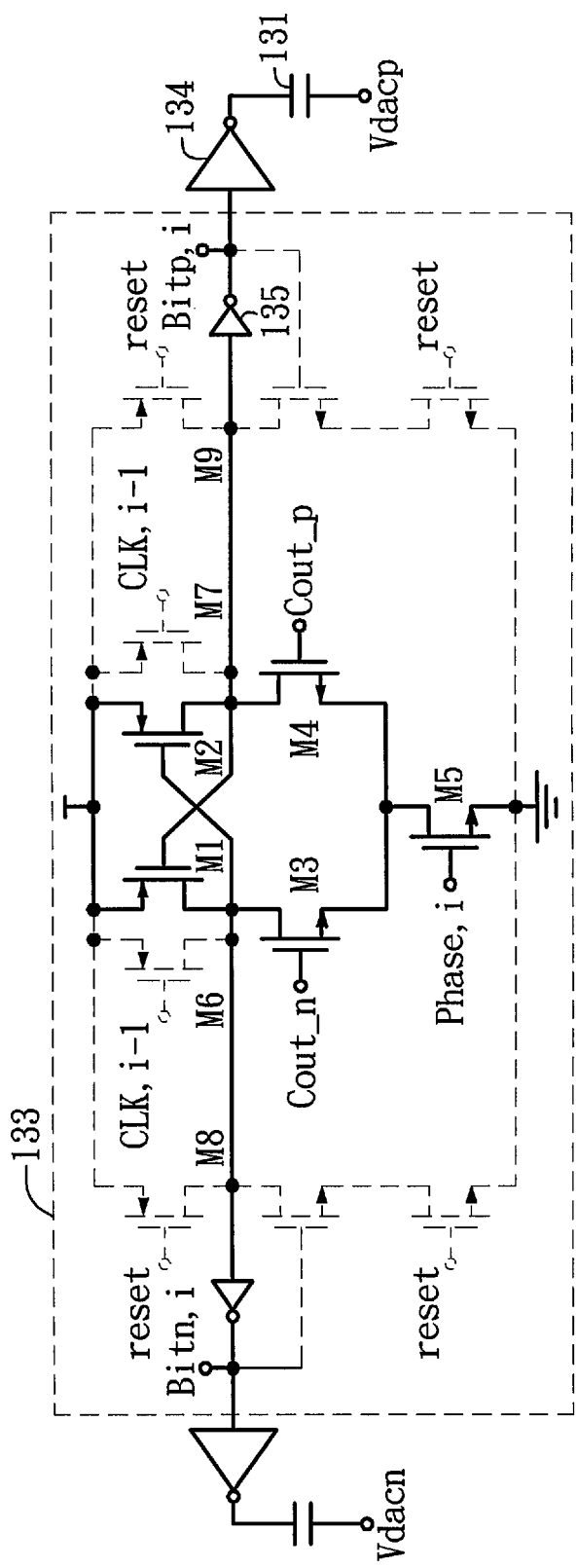

Afterwards, in a switching phase shown in FIG. 6D with solid lines indicating signal paths in the current phase, as the phase signal (Phase,i) becomes asserted, the phase transistor M5 is activated, and the compare transistors M3 and M4 may then receive comparison outputs Cout_n and Cout_p from the comparator 12.

Figure 6E:
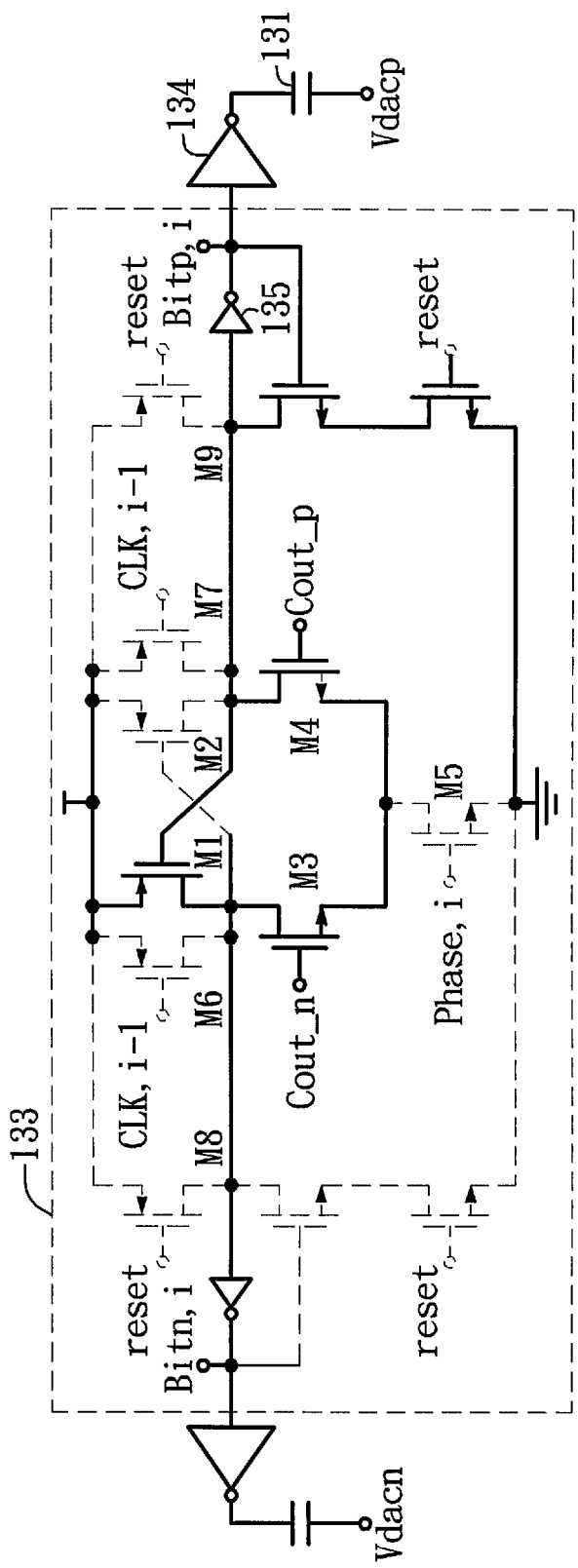

Finally, in a latch phase shown in FIG. 6E with solid lines indicating signal paths in the current phase, the phase transistor M5 is inactivated, and the data stored in the memory circuit (M1-M5) may be latched until next reset phase.

Although specific embodiments have been illustrated and described, it will be appreciated by those skilled in the art that various modifications may be made without departing from the scope of the present invention, which is intended to be limited solely by the appended claims.

What is claimed is:

1. A successive approximation register analog-to-digital converter (SAR ADC), comprising:
   a sample circuit configured to sample an input voltage, thereby resulting in a sampled input voltage;
   a comparator coupled to receive the sampled input voltage; and
   a pair of arrays each including individually switchable binary-weighted capacitors that are switchably coupled to an output of the comparator via phase switches, respectively;
   wherein a phase signal for controlling a corresponding phase switch associated with a current bit becomes asserted when a preceding bit finishes comparison, and the phase signal becomes de-asserted when the current bit finishes comparison.

2. The SAR ADC of claim 1, wherein first ends of the capacitors of each array are coupled to an input of the comparator, and second ends of the capacitors are switchably coupled to the output of the comparator via the phase switches, respectively.

3. The SAR ADC of claim 1, wherein the preceding bit finishes comparison when voltages across the corresponding capacitors of the arrays have different logic states; and the current bit finishes comparison when voltages across the corresponding capacitors of the arrays have different logic states.

4. The SAR ADC of claim 3, further comprising a timing logic configured to generate a finish signal for each bit under comparison according to a logic state of the corresponding capacitors.

5. The SAR ADC of claim 4, wherein the timing logic comprises a plurality of OR gates, each having two inputs respectively coupled to receive inverted logic states of the capacitors, and accordingly generates the finish signal.

6. The SAR ADC of claim 5, further comprising one or more delay cells that are cascaded after some of the OR gates.

7. The SAR ADC of claim 6, wherein more delay cells are used with respect to a more-significant-bit than a less-significant-bit.

8. The SAR ADC of claim 4, further comprising a phase-generating AND gate with two inputs coupled to receive a finish signal of a preceding bit and an inverted finish signal of a current bit, thereby generating the phase signal of the current bit.

9. The SAR ADC of claim 3, wherein the logic state of the capacitor is retrieved from an intermediate node located between a latch and an inverter, where the latch and the inverter are disposed between the corresponding phase switch and the capacitor.

10. The SAR ADC of claim 9, wherein the latch comprises two inverters that are cross-coupled in a closed loop.

11. The SAR ADC of claim 1, wherein the comparator performs comparison only when output voltages of the comparator become valid and the capacitors become stable.

12. The SAR ADC of claim 11, further comprising an AND gate coupled to receive the output voltages of the comparator, therefore generating a valid signal indicating that the output voltages of the comparator become valid.

13. The SAR ADC of claim 12, wherein the comparator performs comparison when a compare clock is asserted only when the valid signal is asserted and at least one phase signal is asserted.

* * * * *